(12) United States Patent
Min et al.

(10) Patent No.: US 12,730,133 B2
(45) Date of Patent: Sep. 8, 2026

(54) CURRENT SENSING DEVICE AND DIRECT-CURRENT (DC)/DC CONVERTER INCLUDING THE SAME

(71) Applicant: HL MANDO CORPORATION, Pyeongtaek (KR)

(72) Inventors: Ju Hong Min, Seongnam (KR); Chang Kyu Bai, Yongin (KR)

(73) Assignee: HL MANDO CORPORATION, Pyeongtaek (KR)

( * ) Notice: Subject to any disclaimer, the term of this patent is extended or adjusted under 35 U.S.C. 154(b) by 340 days.

(21) Appl. No.: 18/531,804

(22) Filed: Dec. 7, 2023

(65) Prior Publication Data

US 2024/0393371 A1 Nov. 28, 2024

(30) Foreign Application Priority Data

May 24, 2023 (KR) ........................ 10-2023-0067138

(51) Int. Cl.
*G01R 15/18* (2006.01)
*H02M 1/00* (2006.01)

(52) U.S. Cl.
CPC ........ *G01R 15/183* (2013.01); *H02M 1/0009* (2021.05)

(58) Field of Classification Search
CPC . H02M 1/0009; G01R 19/14; G01R 19/0092; G01R 15/183
See application file for complete search history.

(56) References Cited

U.S. PATENT DOCUMENTS 9,632,118 B2 4/2017 Yang
9,762,119 B2 9/2017 Kim
(Continued)

FOREIGN PATENT DOCUMENTS

KR 10-1305035 B1 9/2013
KR 10-1601516 B1 3/2016
(Continued)

OTHER PUBLICATIONS

Office Action From Korean Patent Office, Dated Sep. 30, 2025.

*Primary Examiner* — Alex Torres-Rivera
(74) *Attorney, Agent, or Firm* — Harvest IP Law, LLP

(57) ABSTRACT

A current sensing device for sensing an alternating current includes a current transformer that includes a primary side constituting at least a part of a path through which a sensing target current flows in a sensing target circuit, and is configured to generate, to a secondary side, an output current according to characteristics of the sensing target current, a voltage limiting circuit that is connected to both ends of the secondary side and is configured to provide a path through which at least a part of the output current flows, and to limit a voltage applied to both ends of the secondary side in a distinguishable manner according to a direction of the output current, a sensing voltage generation circuit configured to generate a sensing voltage based in part on at least one of the output current and a voltage of the voltage limiting circuit, and a current direction limiting circuit that electrically connects both ends of the secondary side to the sensing voltage generation circuit, and is configured to limit a direction of a current transferred from both ends of the secondary side to the sensing voltage generation circuit.

14 Claims, 8 Drawing Sheets

(56) References Cited

U.S. PATENT DOCUMENTS

| | | | | |
|---|---|---|---|---|
| 2002/0131224 | A1* | 9/2002 | Yoshida .................. | H02M 1/32<br>361/93.5 |
| 2016/0161530 | A1 | 6/2016 | Lee | |
| 2017/0353098 | A1 | 12/2017 | Baek | |
| 2019/0305671 | A1* | 10/2019 | Matsuura .............. | H02M 1/083 |

FOREIGN PATENT DOCUMENTS

| | | | |
|---|---|---|---|
| KR | 10-1617130 | B1 | 4/2016 |
| KR | 2016-0068058 | A | 6/2016 |
| KR | 10-2016-0115648 | A | 10/2016 |
| KR | 10-1731477 | B1 | 4/2017 |

* cited by examiner

Figure 1:
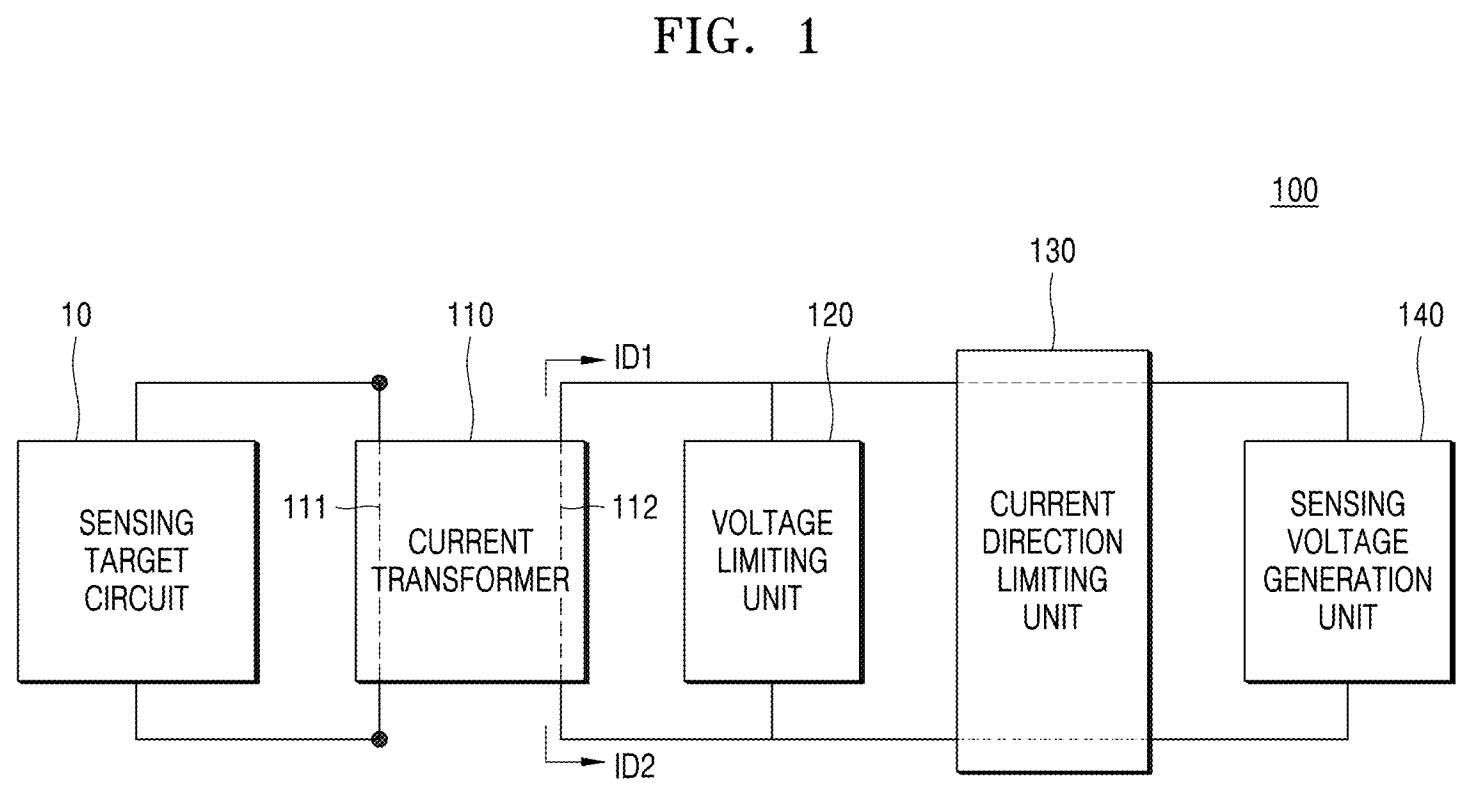

10 SENSING TARGET CIRCUIT

110 CURRENT TRANSFORMER

111

112

ID1

ID2

120 VOLTAGE LIMITING UNIT

130 CURRENT DIRECTION LIMITING UNIT

140 SENSING VOLTAGE GENERATION UNIT 100
140
141
142
143
130
131
120
123
122
121
110
112
111
SENSING TARGET CIRCUIT
10

CURRENT SENSING DEVICE AND DIRECT-CURRENT (DC)/DC CONVERTER INCLUDING THE SAME

CROSS-REFERENCE TO RELATED APPLICATION

This application is based on and claims priority under 35 U.S.C. § 119 to Korean Patent Application No. 10-2023-0067138, filed on May 24, 2023, in the Korean Intellectual Property Office, the disclosure of which is incorporated by reference herein in its entirety.

BACKGROUND

1. Field

Embodiments relate to a current sensing device and a direct-current (DC)/DC converter including the current sensing device.

2. Description of the Related Art

With the development of fuel cell electric vehicles (FCEVs), electric vehicles (EVs), and hybrid electric vehicles (HEVs), alternators (or generators) used in internal-combustion-engine vehicles have been replaced with direct-current (DC)/DC converters.

A DC/DC converter converts high-voltage electrical energy stored in a high-voltage battery into a low voltage to charge a 12 V battery and supply power to electrical components.

For automotive DC/DC converters, Hall-type sensors are sometimes used on the output side of the converter, considering the use of high current. However, as the Hall-type sensors are not suitable in terms of cost, size, and assemblability, some DC/DC converters are configured to estimate an output current through input current sensing and input/output voltage sensing.

As a DC/DC converter input current corresponds to a high current, it is desirable to use a current transformer for indirect measurement. However, offset currents generated according to the characteristics of current transformers lead to limited situations in which the current transformers are available. In particular, it is difficult to accurately measure a current because the offset current fluctuates with the load conditions of the DC/DC converters.

SUMMARY

Provided is a current sensing device in which an offset of a sensing current does not fluctuate greatly despite a change in a load condition of a sensing target circuit.

Provided is a direct-current (DC)/DC converter capable of obtaining high-accuracy current measurement values even under various load conditions.

Additional aspects will be set forth in part in the description which follows and, in part, will be apparent from the description, or may be learned by practice of the presented embodiments of the disclosure.

According to an aspect of the disclosure, a current sensing device for sensing an alternating current includes a current transformer that includes a primary side constituting at least a part of a path through which a sensing target current flows in a sensing target circuit, and is configured to generate, to a secondary side, an output current according to characteristics of the sensing target current, a voltage limiting circuit that is connected to both ends of the secondary side and is configured to provide a path through which at least a part of the output current flows, and to limit a voltage applied to both ends of the secondary side in a distinguishable manner according to a direction of the output current, a sensing voltage generation circuit configured to generate a sensing voltage based in part on at least one of the output current and a voltage of the voltage limiting circuit, and a current direction limiting circuit that electrically connects both ends of the secondary side to the sensing voltage generation circuit, and is configured to limit a direction of a current transferred from both ends of the secondary side to the sensing voltage generation circuit.

The voltage limiting circuit may include a first voltage generation circuit configured to generate a voltage proportional to the magnitude of at least a part of an output current of the current transformer in a first direction, or the magnitude of at least a part of an output current of the current transformer in a second direction, and a second voltage generation circuit that is connected in series to the first voltage generation circuit between both ends of the secondary side, and is configured to, upon the current transformer generating the output current in the first direction, generate a voltage corresponding to a preset first voltage regardless of the magnitude of the output current in the first direction, and upon the current transformer generating the output current in the second direction, generate a voltage corresponding to a preset second voltage regardless of the magnitude of the output current in the second direction. Here, the first voltage and the second voltage may be different from each other. In addition, the absolute value of the second voltage may be greater than the absolute value of the first voltage.

The voltage applied to both ends of the secondary side may correspond to the sum of the voltage generated by the first voltage generation circuit and the voltage generated by the second voltage generation circuit.

The voltage limiting circuit may further include a second current direction limiting circuit configured to limit a flow of a current in the first direction through the voltage limiting circuit and allow a flow of a current in the second direction.

The current direction limiting circuit may include a first current direction limiting circuit configured to allow a flow of at least a part of an output current in a first direction generated by the current transformer to the sensing voltage generation circuit, and to limit a flow of at least a part of an output current in a second direction generated by the current transformer to the sensing voltage generation circuit.

The sensing voltage generation circuit may include a third voltage generation circuit configured to generate a voltage proportional to a magnitude of a current flowing through the sensing voltage generation circuit.

In response to the current transformer generating an output current in a first direction, the voltage limiting circuit may be further configured to allow a voltage at both ends of the secondary side to be a third voltage as at least a part of the output current in the first direction flows through the voltage limiting circuit, the current direction limiting circuit may be further configured to allow a remaining part of the output current in the first direction to flow to the sensing voltage generation circuit, and the sensing voltage generation circuit may be further configured to generate a first sensing voltage proportional to the magnitude of the remaining part of the output current in the first direction.

In response to the current transformer generating an output current in a second direction, the voltage limiting circuit may be further configured to allow a voltage at both ends of the secondary side to be a fourth voltage as at least a part of the output current in the second direction flows through the voltage limiting circuit, the current direction limiting circuit may be further configured to limit a flow of the output current in the second direction to the sensing voltage generation circuit, and the sensing voltage generation circuit may be further configured to generate a second sensing voltage according to the fourth voltage.

According to another aspect of the disclosure, a direct-current (DC)/DC converter includes an input side to which an input voltage is applied, an output side to which an output voltage generated from the input voltage is applied, and a current sensing device configured to constitute, in any one of the input side and the output side, at least a part of a path through which a current flows and to sense the flowing current. Here, the current sensing device may include a current transformer that includes a primary side constituting at least a part of a path through which a sensing target current flows, in any one of the input side and the output side, and is configured to generate, to a secondary side, an output current according to characteristics of the sensing target current, a voltage limiting circuit that is connected to both ends of the secondary side and is configured to provide a path through which at least a part of the output current flows, and to limit a voltage applied to both ends of the secondary side in a distinguishable manner according to a direction of the output current, a sensing voltage generation circuit configured to generate a sensing voltage based in part on at least one of the output current and a voltage of the voltage limiting circuit, and a current direction limiting circuit that electrically connects both ends of the secondary side to the sensing voltage generation circuit, and is configured to limit a direction of a current transferred from both ends of the secondary side to the sensing voltage generation circuit.

The voltage limiting circuit may include a first voltage generation circuit configured to generate a voltage proportional to the magnitude of at least a part of an output current of the current transformer in a first direction, or the magnitude of at least a part of an output current of the current transformer in a second direction, and a second voltage generation circuit that is connected in series to the first voltage generation circuit between both ends of the secondary side, and is configured to, upon the current transformer generating the output current in the first direction, generate a voltage corresponding to a preset first voltage regardless of the magnitude of the output current in the first direction, and upon the current transformer generating the output current in the second direction, generate a voltage corresponding to a preset second voltage regardless of the magnitude of the output current in the second direction. Here, the first voltage and the second voltage may be different from each other, and the absolute value of the second voltage may be greater than the absolute value of the first voltage.

The voltage applied to both ends of the secondary side may correspond to the sum of the voltage generated by the first voltage generation circuit and the voltage generated by the second voltage generation circuit.

The voltage limiting circuit may further include a second current direction limiting circuit configured to limit a flow of a current in the first direction through the voltage limiting circuit and allow a flow of a current in the second direction.

The current direction limiting circuit may include a first current direction limiting circuit configured to allow a flow of at least a part of an output current in a first direction generated by the current transformer to the sensing voltage generation circuit, and to limit a flow of at least a part of an output current in a second direction generated by the current transformer to the sensing voltage generation circuit.

The sensing voltage generation circuit may include a third voltage generation circuit configured to generate a voltage proportional to a magnitude of a current flowing through the sensing voltage generation circuit.

In response to the current transformer generating an output current in a first direction, the voltage limiting circuit may be further configured to allow a voltage at both ends of the secondary side to be a third voltage as at least a part of the output current in the first direction flows through the voltage limiting circuit, the current direction limiting circuit may be further configured to allow a remaining part of the output current in the first direction to flow to the sensing voltage generation circuit, and the sensing voltage generation circuit may be further configured to generate a first sensing voltage proportional to the magnitude of the remaining part of the output current in the first direction.

In response to the current transformer generating an output current in a second direction, the voltage limiting circuit may be further configured to allow a voltage at both ends of the secondary side to be a fourth voltage as at least a part of the output current in the second direction flows through the voltage limiting circuit, the current direction limiting circuit may be further configured to limit a flow of the output current in the second direction to the sensing voltage generation circuit, and the sensing voltage generation circuit may be further configured to generate a second sensing voltage according to the fourth voltage.

BRIEF DESCRIPTION OF THE DRAWINGS

The above and other aspects, features, and advantages of certain embodiments of the disclosure will be more apparent from the following description taken in conjunction with the accompanying drawings, in which:

FIG. 1 is a diagram schematically illustrating an example configuration of a current sensing device according to an embodiment;

DETAILED DESCRIPTION

Figure 2:
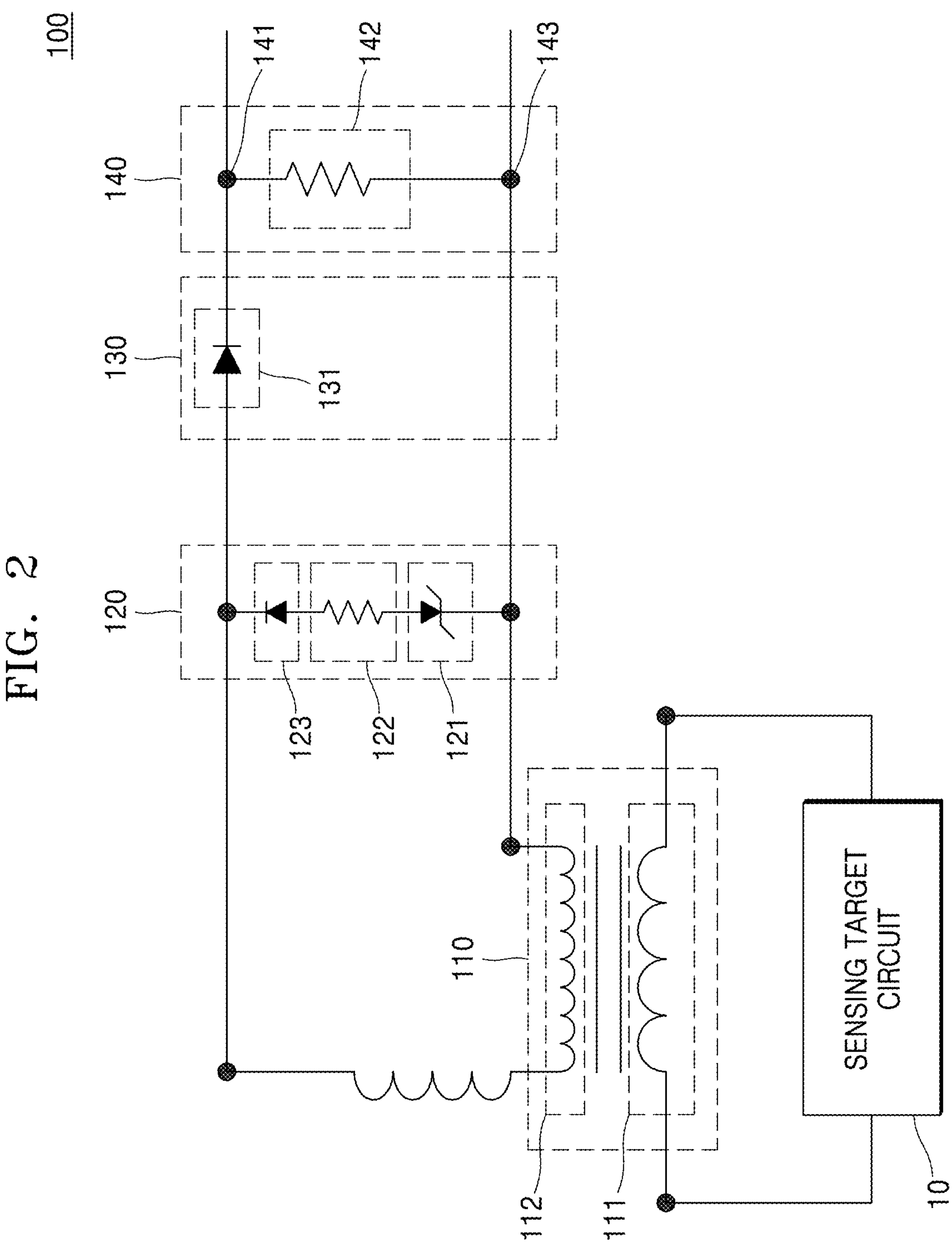
FIG. 2 is a diagram illustrating an example circuit configuration of a current sensing device according to an embodiment.

Reference will now be made in detail to embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects of the present description. As used herein, the term "and/or" includes any and all combinations of one or more of the associated listed items. Expressions such as "at least one of," when preceding a list of elements, modify the entire list of elements and do not modify the individual elements of the list.

As the disclosure allows for various changes and numerous embodiments, particular embodiments will be illustrated in the drawings and described in detail. The effects and features of the disclosure and methods of achieving them will become clear with reference to the embodiments described in detail below with the drawings. However, the disclosure is not limited to the embodiments disclosed below, and may be implemented in various forms.

Hereinafter, embodiments will be described in detail with reference to the accompanying drawings, and the same or corresponding components will be denoted by the same reference numerals when described with reference to the accompanying drawings, and thus, their descriptions that are already provided will be omitted.

In the following embodiments, terms such as "first," "second," etc., are used only to distinguish one component from another, and such components must not be limited by these terms. In the following embodiments, the singular expression also includes the plural meaning as long as it is not inconsistent with the context. In the following embodiments, the terms "comprises," "includes," "has", and the like used herein specify the presence of stated features or components, but do not preclude the presence or addition of one or more other features or components. For convenience of description, the magnitude of components in the drawings may be exaggerated or reduced. For example, each component in the drawings is illustrated to have an arbitrary size and shape for ease of description, and thus the disclosure is not limited to the drawings.

FIG. 1 is a diagram schematically illustrating an example configuration of a current sensing device 100 according to an embodiment. FIG. 2 is a diagram illustrating an example circuit configuration of the current sensing device 100 according to an embodiment. Hereinafter, descriptions will be provided with reference to FIGS. 1 and 2 together.

The current sensing device 100 according to an embodiment may sense a sensing target current flowing through a sensing target circuit 10. In this case, the sensing target current may be a current whose magnitude and/or polarity changes over time. For example, the sensing target current may be an alternating current.

The current sensing device 100 according to an embodiment may include a current transformer 110, a voltage limiting circuit 120, a current direction limiting circuit 130, and a sensing voltage generation circuit 140.

The current transformer 110 according to an embodiment may include a primary side 111 constituting at least a part of a path through which the sensing target current flows in the sensing target circuit 10, and may generate an output current according to the characteristics of the sensing target current, to a secondary side 112.

In an embodiment, as illustrated in FIG. 2, the current transformer 110 may include a coil corresponding to the primary side 111, a coil corresponding to the secondary side 112, and a core (or an iron core) for mediating magnetic flux between the two coils 111 and 112. However, this configuration is merely an example and the spirit of the disclosure is not limited thereto.

The voltage limiting circuit 120 according to an embodiment may be connected to both ends of the secondary side 112 of the current transformer 110 to limit the voltage applied to both ends in a distinguishable manner according to the direction of the output current of the current transformer 110. For example, the voltage limiting circuit 120 may limit the voltage applied to both ends in different manners in a case in which the output current flows in a first direction ID1 and a case in which the output current flows in the opposite direction, that is, a second direction ID2, which will be described in detail below.

As illustrated in FIG. 2, the voltage limiting circuit 120 according to an embodiment may include a second voltage generation circuit 121, a first voltage generation circuit 122, and a second current direction limiting circuit 123.

The first voltage generation circuit 122 according to an embodiment may generate a voltage proportional to the magnitude of at least a part of the output current of the current transformer 110 in the first direction ID1, or the magnitude of at least a part of the output current of the current transformer 110 in the second direction ID2. In other words, the first voltage generation circuit 122 may generate a voltage proportional to the magnitude of a current flowing through the voltage limiting circuit 120 regardless of the directionality of the output current.

In an embodiment, the first voltage generation circuit 122 may include a resistive element as illustrated in FIG. 2.

The second voltage generation circuit 121 according to an embodiment may be connected in series to the first voltage generation circuit 122 between both ends of the secondary side 112 of the current transformer 110 to generate different voltages according to the direction of the current flowing through the voltage limiting circuit 120. For example, when the current transformer 110 generates the output current in the first direction ID1 and thus at least a part of the output current flows through the voltage limiting circuit 120, the second voltage generation circuit 121 may generate a voltage corresponding to a preset first voltage regardless of the magnitude of the at least a part of the output current flowing through the voltage limiting circuit 120.

In addition, when the current transformer 110 generates the output current in the second direction ID2 and thus at least a part of the output current flows through the voltage limiting circuit 120, the second voltage generation circuit 121 may generate a voltage corresponding to a preset second voltage regardless of the magnitude of the at least a part of the output current flowing through the voltage limiting circuit 120. The first voltage and the second voltage may be different from each other, and may be configured to have appropriate values according to the required specifications of the current sensing device. In an embodiment, the absolute value of the second voltage may be greater than the absolute value of the first voltage.

In an embodiment, the second voltage generation circuit 121 may be configured as a Zener diode as illustrated in FIG. 2, and accordingly, the first voltage may correspond to a clamping voltage of the Zener diode, and the second voltage may correspond to a breakdown voltage of the Zener diode.

The second current direction limiting circuit 123 according to an embodiment may limit the flow of a current in the first direction ID1 through the voltage limiting circuit 120 and allow the flow of a current in the second direction ID2. In an embodiment, the second current direction limiting circuit 123 may be configured as a diode.

According to the above-described configuration of the voltage limiting circuit 120, the voltage applied to both ends of the secondary side 112 of the current transformer 110 may correspond to a voltage corresponding to the sum of a voltage generated by the first voltage generation circuit 122 and a voltage generated by the second voltage generation circuit 121. In an alternative embodiment, the voltage applied to both ends of the secondary side 112 of the current transformer 110 may correspond to a voltage corresponding to the sum of a voltage generated by the first voltage generation circuit 122, a voltage generated by the second voltage generation circuit 121, and a voltage generated by the second current direction limiting circuit 123.

In the disclosure, that 'the voltage of A corresponds to the voltage of B' does not mean that the voltage of A and the voltage of B are the same, but may mean that B is included in the factors that affects the determination of the voltage of A.

The current direction limiting circuit 130 according to an embodiment may electrically connect both ends of the secondary side 112 of the current transformer 110 to the sensing voltage generation circuit 140 to be described below, and may limit the direction of a current transferred from both ends of the secondary side 112 to the sensing voltage generation circuit 140.

In an embodiment, the current direction limiting circuit 130 may include a first current direction limiting circuit 131 configured to allow the flow of at least a part of the output current in the first direction ID1 generated by the current transformer 110 to the sensing voltage generation circuit 140, and to limit the flow of at least a part of the output current in the second direction ID2 generated by the current transformer 110 to the sensing voltage generation circuit 140.

In an embodiment, as illustrated in FIG. 2, the first current direction limiting circuit 131 may be configured as a diode.

The sensing voltage generation circuit 140 according to an embodiment may generate a sensing voltage based in part on at least one of the output current generated by the current transformer 110 and the voltage of the voltage limiting circuit 120.

In an embodiment, the sensing voltage generation circuit 140 may include a third voltage generation circuit 142 configured to generate a voltage proportional to the magnitude of the current flowing through the sensing voltage generation circuit 140, and voltage output terminals 141 and 143.

In an embodiment, as illustrated in FIG. 2, the third voltage generation circuit 142 may be configured as a resistive element.

Figure 3:
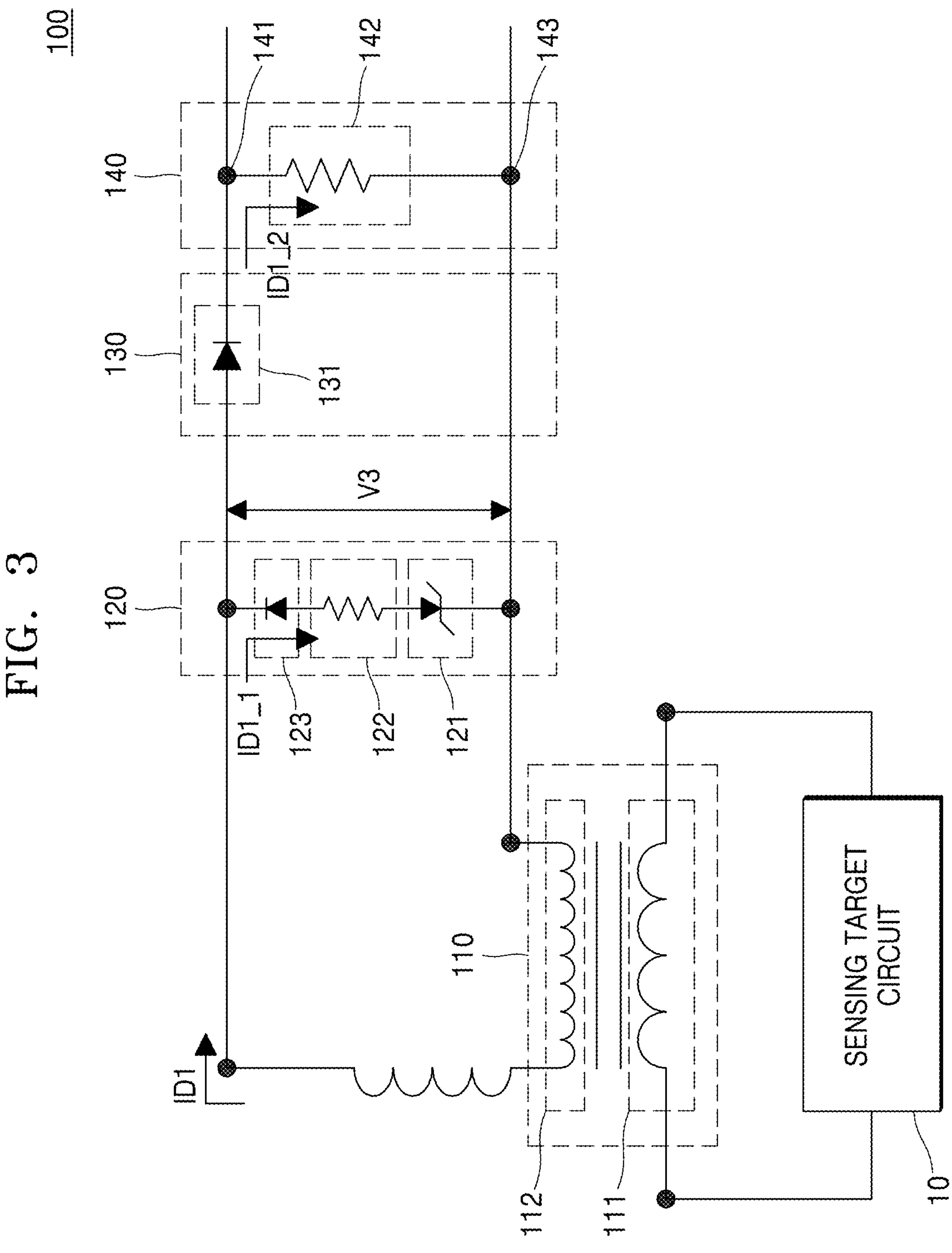
FIG. 3 is a diagram for describing an operation of a current sensing device when a current transformer generates a current in a first direction.

FIG. 3 is a diagram for describing an operation of the current sensing device 100 when the current transformer 110 generates a current in the first direction ID1.

Hereinafter, for convenience of description, it is assumed that the current transformer 110 has generated a current in the first direction ID1, and accordingly, currents ID1_1 and ID1_2 flow through the voltage limiting circuit 120 and the sensing voltage generation circuit 140, respectively.

Under the above assumption, as at least a part (ID1_1) of the output current in the first direction ID1 flows through the voltage limiting circuit 120, the voltage limiting circuit 120 may allow the voltage at both ends of the secondary side 112 of the current transformer 110 to be a third voltage V3.

In addition, the current direction limiting circuit 130 may allow the remaining part (ID1_2) of the output current in the first direction ID1 to flow to the sensing voltage generation circuit 140.

In addition, the sensing voltage generation circuit 140 may generate a first sensing voltage proportional to the magnitude of the remaining part (ID1_2) of the output current in the first direction ID1.

The third voltage V3 may correspond to a voltage corresponding to the sum of the voltage generated by the first voltage generation circuit 122 and the voltage generated by the second voltage generation circuit 121. Here, the first voltage generation circuit 122 may generate a voltage proportional to the at least a part (ID1_1) of the output current, and the second voltage generation circuit 121 may generate a first voltage regardless of the magnitude of the at least a part (ID1_1) of the output current.

Figure 4:
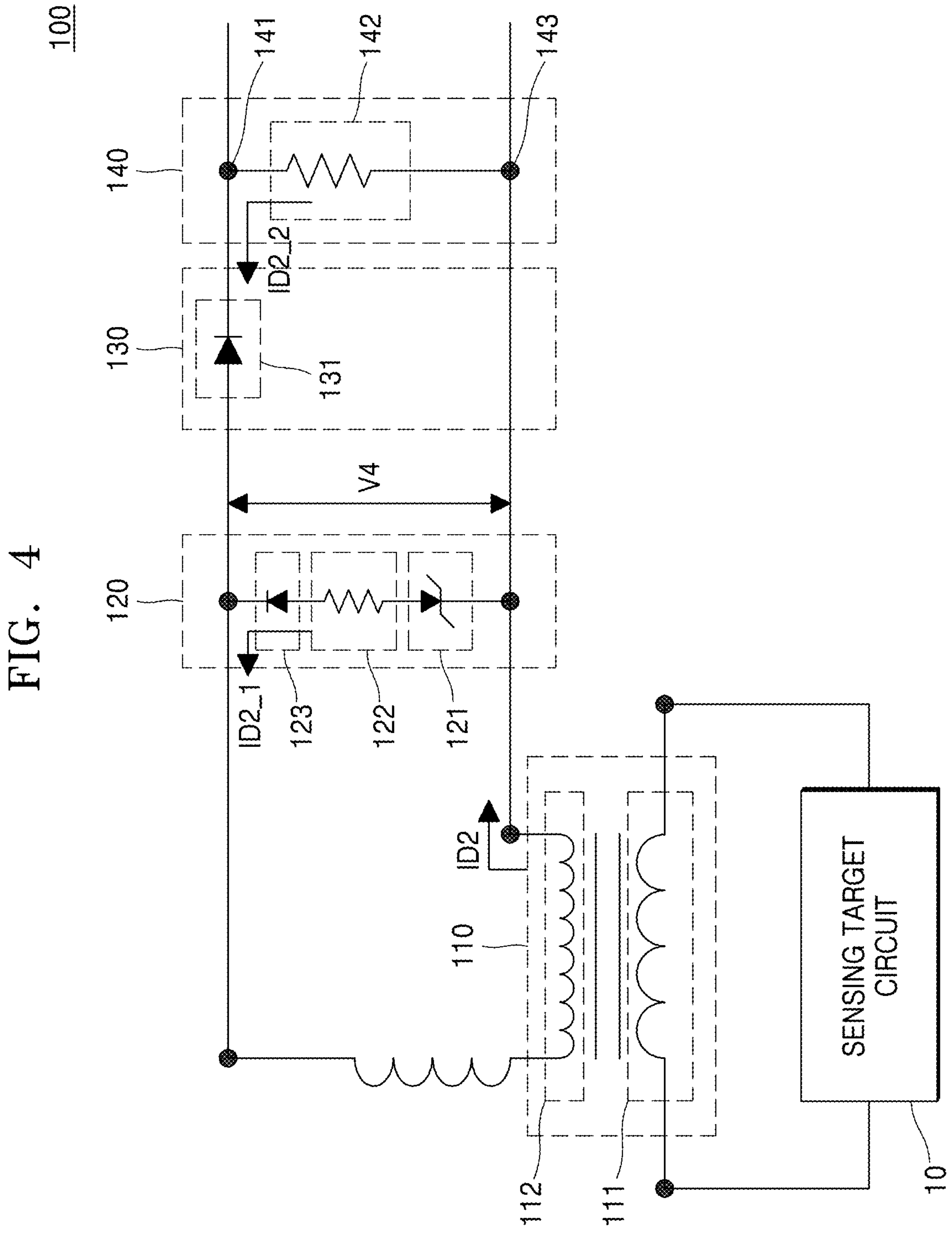
FIG. 4 is a diagram for describing an operation of a current sensing device when a current transformer generates a current in a second direction.

FIG. 4 is a diagram for describing an operation of the current sensing device 100 when the current transformer 110 generates a current in the second direction ID2.

Hereinafter, for convenience of description, it is assumed that the current transformer 110 has generated a current in the second direction ID2, and accordingly, currents ID2_1 and ID2_2 flow through the voltage limiting circuit 120 and the sensing voltage generation circuit 140, respectively.

Under the above assumption, as at least a part (ID2_1) of the output current in the second direction ID2 flows through the voltage limiting circuit 120, the voltage limiting circuit 120 may allow the voltage at both ends of the secondary side 112 of the current transformer 110 to be a fourth voltage V4.

In addition, the current direction limiting circuit 130 may limit the flow of the output current in the second direction ID2 to the sensing voltage generation circuit 140.

In addition, the sensing voltage generation circuit 140 may generate a second sensing voltage according to the fourth voltage V4 generated by the voltage limiting circuit 120.

The fourth voltage V4 may correspond to a voltage corresponding to the sum of the voltage generated by the first voltage generation circuit 122 and the voltage generated by the second voltage generation circuit 121. The first voltage generation circuit 122 may generate a voltage proportional to the at least a part (ID2_1) of the output current, and the second voltage generation circuit 121 may generate a second voltage regardless of the magnitude of the at least a part (ID2_1) of the output current.

Figure 5:
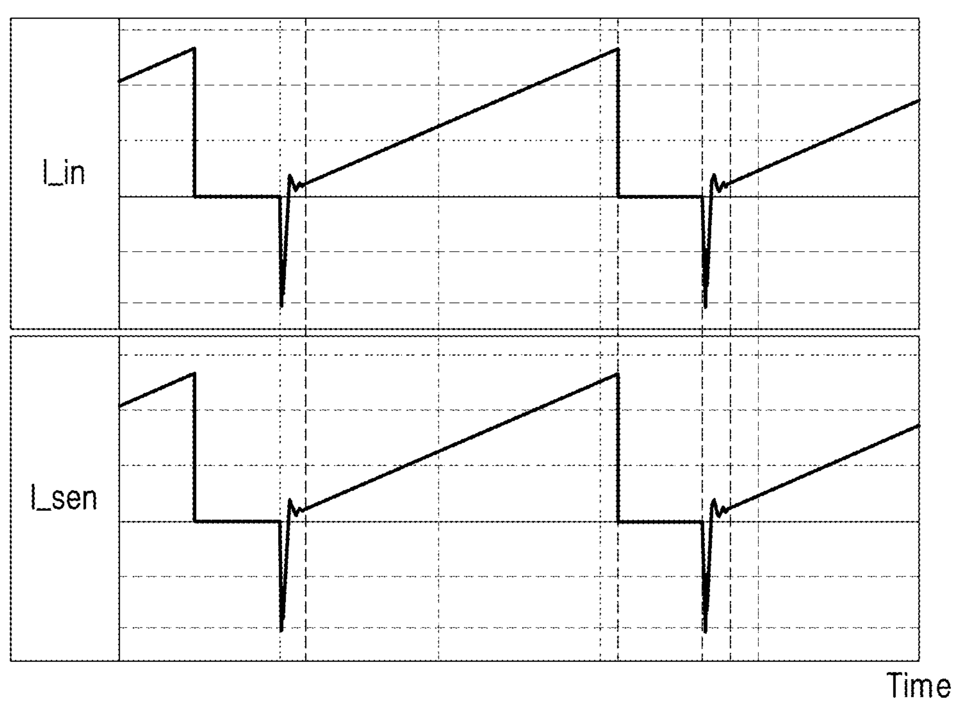
FIG. 5 is a diagram illustrating a sensing current sensed by a current sensing device, according to an embodiment.
Figure 6:
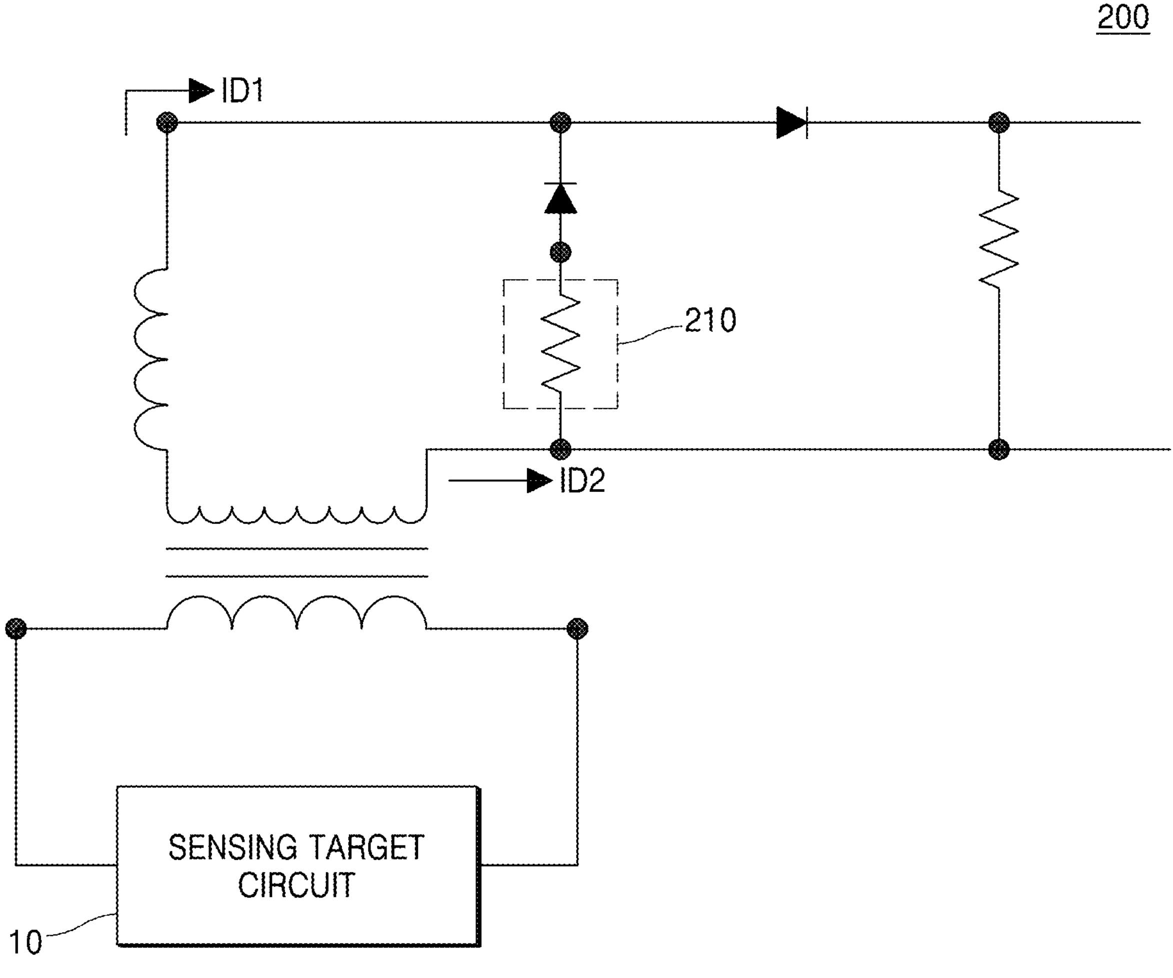
FIG. 6 is a diagram schematically illustrating a configuration of a current sensing device according to the related art.
Figure 7:
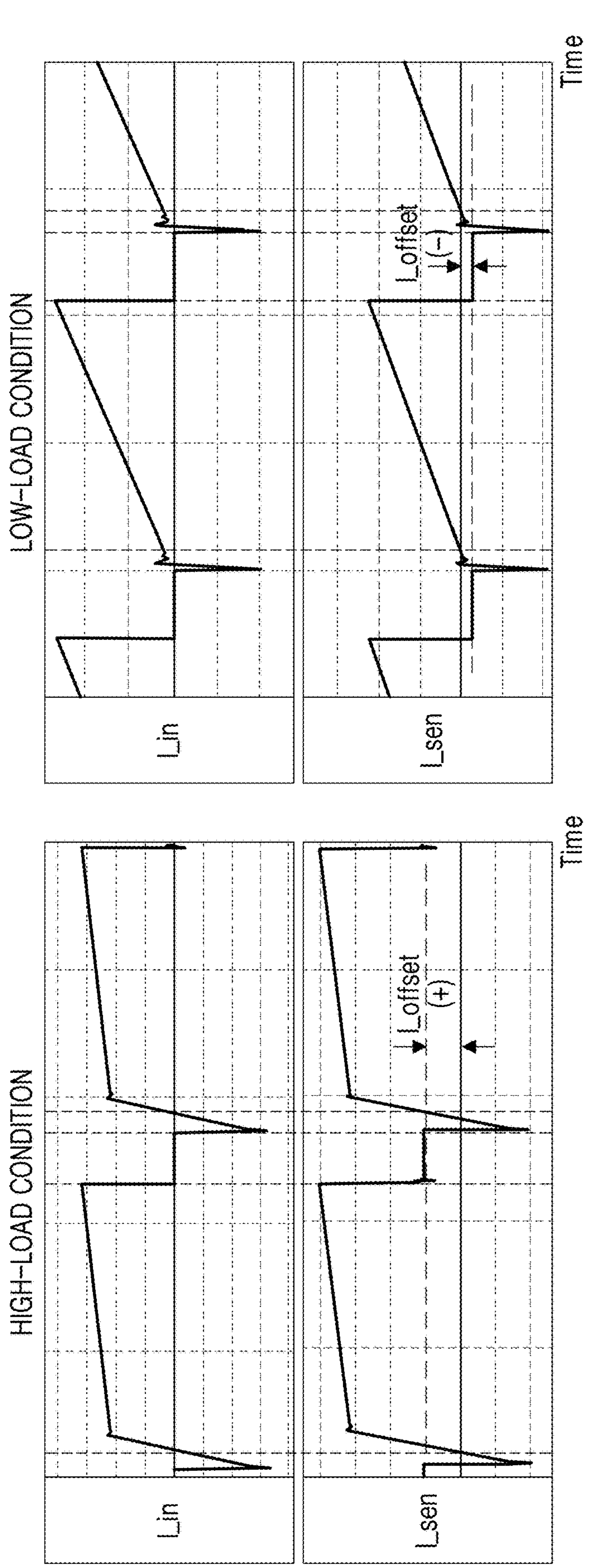
FIG. 7 is a diagram illustrating a sensing current of a current sensing device, according to the related art.

FIG. 5 is a diagram illustrating a sensing current I_sen sensed by a current sensing device, according to an embodiment. FIG. 6 is a diagram schematically illustrating a configuration of a current sensing device 200 according to the related art. FIG. 7 is a diagram illustrating a sensing current I_sen of the current sensing device 200, according to the related art. Hereinafter, descriptions will be provided with reference to FIGS. 5 to 7 together.

The current sensing device 200 according to the related art is configured to include a discharge circuit implemented as a resistive element 210, and the discharge circuit performs a function of compensating for the difference between energy charged in the current transformer and energy discharged from the current transformer during a current sensing process.

However, as illustrated in FIG. 7, due to the resistive element 210, the offset of the sensing current I_sen varies depending on the load conditions and/or the size of the sensing target circuit 10, and thus, the current sensing accuracy is deteriorated.

Some related-art techniques attempt to solve this issue by optimizing the resistance component of the resistive element 210, but there is a clear limitation in that such methods are only effective under particular load conditions (the load conditions of the sensing target circuit 10), and do not ensure the accuracy of the current sensing device 200 under various load conditions (the load conditions of the circuit to be sensed 10).

However, according to the disclosure, by limiting the voltage at both ends of the current transformer through the voltage limiting circuit 120, the difference between energy charged in the current transformer 110 and energy discharged from the current transformer 110 may be compensated for.

In addition, according to the disclosure, through the configuration as illustrated in FIG. 5, the current sensing device 100 may generate the sensing current I_sen according to a sensing target current I_in, even under various load conditions (the load conditions of the sensing target circuit 10).

Figure 8:
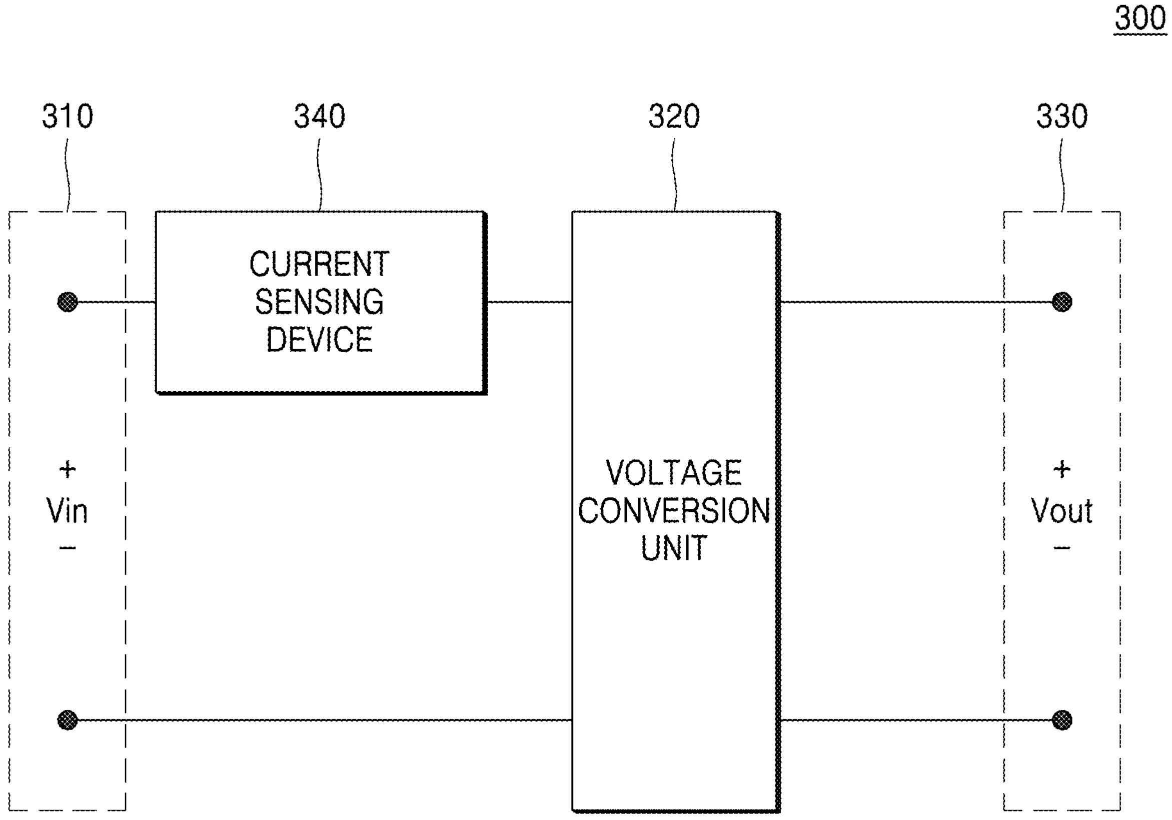
FIG. 8 is a diagram schematically illustrating a configuration of a direct-current (DC)/DC converter including a current sensing device, according to an embodiment.

FIG. 8 is a diagram schematically illustrating a configuration of a direct-current (DC)/DC converter 300 including a current sensing device 340, according to an embodiment.

The DC/DC converter 300 according to an embodiment may refer to a device configured to convert an input voltage Vin into a certain output voltage Vout and output the output voltage Vout. For example, the DC/DC converter may be a device installed in an electrified vehicle having a high-voltage battery to convert a voltage of the high-voltage battery into a voltage to be supplied to electrical components of the vehicle, and output the resulting voltage. However, this is merely an example and the spirit of the disclosure is not limited thereto.

The DC/DC converter according to an embodiment may include an input side 310 to which the input voltage Vin is applied, a voltage conversion circuit 320 configured to convert the input voltage Vin into the output voltage Vout, an output side 330 to which the output voltage Vout generated from the input voltage Vin is applied, and the current sensing device 340 constituting at least a part of a path through which a current flows in any one of the input side 310 and the output side 330, and configured to sense the flowing current. Although FIG. 8 illustrates that the current sensing device 340 is located on the input side 310, this is merely an example and the spirit of the disclosure is not limited thereto. Thus, the current sensing device 340 may be located on the output side 330.

Meanwhile, the current sensing device 340 constituting the DC/DC converter 300 is described in detail above with reference to FIGS. 1 to 7, and thus, a detailed description thereof will be omitted.

As such, the DC/DC converter 300 according to an embodiment may accurately sense an input or output current even under various load conditions.

Particular executions described herein are merely examples and do not limit the scope of the disclosure in any way. For the sake of brevity, related-art electronics, control systems, software and other functional aspects of the systems may not be described in detail. Furthermore, line connections or connection members between elements depicted in the drawings represent functional connections and/or physical or circuit connections by way of example, and in actual applications, they may be replaced or embodied with various suitable additional functional connections, physical connections, or circuit connections. In addition, no item or component is essential to the practice of the disclosure unless the item or component is specifically described as being "essential" or "critical".

Accordingly, the spirit of the disclosure should not be limited to the above-described embodiments, and all modifications and variations which may be derived from the meanings, scopes and equivalents of the claims should be construed as failing within the scope of the disclosure.

According to the disclosure, it is possible to implement a current sensing device in which an offset of a sensing current does not fluctuate greatly despite a change in a load condition of a sensing target circuit.

In addition, it is possible to implement a DC/DC converter capable of obtaining high-accuracy current measurement values under various load conditions.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope of the disclosure as defined by the following claims.

What is claimed is:

1. A current sensing device for sensing an alternating current, the current sensing device comprising:

a current transformer that comprises a primary side constituting at least a part of a path, through which a sensing target current flows in a sensing target circuit, and a secondary side, and is configured to generate, to the secondary side, an output current according to characteristics of the sensing target current;

a voltage limiting circuit that is connected to both ends of the secondary side and configured to provide a path, through which at least a part of the output current flows, and to limit a voltage applied to the both ends of the secondary side to different limiting levels depending on a direction of the output current, wherein the voltage limiting circuit comprises:

a first voltage generation circuit configured to generate a voltage proportional to a magnitude of at least a part of an output current of the current transformer in a first direction, or a magnitude of at least a part of an output current of the current transformer in a second direction, a second voltage generation circuit that is connected in series to the first voltage generation circuit between the both ends of the secondary side, and is configured to, upon the current transformer generating the output current in the first direction, generate a voltage corresponding to a preset first voltage regardless of the magnitude of the output current in the first direction, and upon the current transformer generating the output current in the second direction, generate a voltage corresponding to a preset second voltage regardless of the magnitude of the output current in the second direction, wherein the preset first voltage and the preset second voltage are different from each other, and a second current direction limiting circuit configured to limit a flow of a current in the first direction through the voltage limiting circuit and allow a flow of a current in the second direction;

a sensing voltage generation circuit configured to generate a sensing voltage based on at least one of the output current or a voltage of the voltage limiting circuit; and a current direction limiting circuit that electrically connects the both ends of the secondary side to the sensing voltage generation circuit, and is configured to limit a direction of a current transferred from the both ends of the secondary side to the sensing voltage generation circuit.

2. The current sensing device of claim 1, wherein an absolute value of the preset second voltage is greater than an absolute value of the preset first voltage.

3. The current sensing device of claim 1, wherein the voltage applied to the both ends of the secondary side corresponds to a sum of the voltage generated by the first voltage generation circuit and the voltage generated by the second voltage generation circuit.

4. The current sensing device of claim 1, wherein the current direction limiting circuit comprises a first current direction limiting circuit configured to allow a flow of at least a part of an output current in a first direction generated by the current transformer to the sensing voltage generation circuit, and to limit a flow of at least a part of an output current in a second direction generated by the current transformer to the sensing voltage generation circuit.

5. The current sensing device of claim 1, wherein the sensing voltage generation circuit comprises a third voltage generation circuit configured to generate a voltage proportional to a magnitude of a current flowing through the sensing voltage generation circuit.

6. The current sensing device of claim 1, wherein, in response to the current transformer generating an output current in a first direction, the voltage limiting circuit is further configured to allow a voltage at the both ends of the secondary side to be a third voltage as at least a part of the output current in the first direction flows through the voltage limiting circuit, the current direction limiting circuit is further configured to allow a remaining part of the output current in the first direction to flow to the sensing voltage generation circuit, and the sensing voltage generation circuit is further configured to generate a first sensing voltage proportional to a magnitude of the remaining part of the output current in the first direction.

7. The current sensing device of claim 1, wherein, in response to the current transformer generating an output current in a second direction, the voltage limiting circuit is further configured to allow a voltage at the both ends of the secondary side to be a fourth voltage as at least a part of the output current in the second direction flows through the voltage limiting circuit, the current direction limiting circuit is further configured to limit a flow of the output current in the second direction to the sensing voltage generation circuit, and the sensing voltage generation circuit is further configured to generate a second sensing voltage according to the fourth voltage.

8. A direct-current (DC)/DC converter comprising:

an input side to which an input voltage is applied;

an output side to which an output voltage generated from the input voltage is applied; and a current sensing device configured to constitute, in any one of the input side and the output side, at least a part of a path through which a current flows and to sense the current that flows, wherein the current sensing device comprises:

a current transformer that comprises a primary side constituting, in any one of the input side and the output side, at least a part of a path through which a sensing target current flows and a secondary side, and is configured to generate, to the secondary side, an output current according to characteristics of the sensing target current;

a voltage limiting circuit that is connected to both ends of the secondary side and is configured to provide a path through which at least a part of the output current flows, and to limit a voltage applied to the both ends of the secondary side to different limiting levels depending on a direction of the output current, wherein the voltage limiting circuit comprises:

a first voltage generation circuit configured to generate a voltage proportional to a magnitude of at least a part of an output current of the current transformer in a first direction, or a magnitude of at least a part of an output current of the current transformer in a second direction, a second voltage generation circuit that is connected in series to the first voltage generation circuit between the both ends of the secondary side, and is configured to, upon the current transformer generating the output current in the first direction, generate a voltage corresponding to a preset first voltage regardless of the magnitude of the output current in the first direction, and upon the current transformer generating the output current in the second direction, generate a voltage corresponding to a preset second voltage regardless of the magnitude of the output current in the second direction, wherein the preset first voltage and the preset second voltage are different from each other, and a second current direction limiting circuit configured to limit a flow of a current in the first direction through the voltage limiting circuit and allow a flow of a current in the second direction;

a sensing voltage generation circuit configured to generate a sensing voltage based on at least one of the output current or a voltage of the voltage limiting circuit; and a current direction limiting circuit that electrically connects the both ends of the secondary side to the sensing voltage generation circuit, and is configured to limit a direction of a current transferred from the both ends of the secondary side to the sensing voltage generation circuit.

9. The DC/DC converter of claim 8, wherein an absolute value of the preset second voltage is greater than an absolute value of the preset first voltage.

10. The DC/DC converter of claim 8, wherein the voltage applied to the both ends of the secondary side is a voltage corresponding to a sum of the voltage generated by the first voltage generation circuit and the voltage generated by the second voltage generation circuit.

11. The DC/DC converter of claim 8, wherein the current direction limiting circuit comprises a first current direction limiting circuit configured to allow a flow of at least a part of an output current in a first direction generated by the current transformer to the sensing voltage generation circuit, and to limit a flow of at least a part of an output current in a second direction generated by the current transformer to the sensing voltage generation circuit.

12. The DC/DC converter of claim 8, wherein the sensing voltage generation circuit comprises a third voltage generation circuit configured to generate a voltage proportional to a magnitude of a current flowing through the sensing voltage generation circuit.

13. The DC/DC converter of claim 8, wherein, in response to the current transformer generating an output current in a first direction, the voltage limiting circuit is further configured to allow a voltage at the both ends of the secondary side to be a third voltage as at least a part of the output current in the first direction flows through the voltage limiting circuit, the current direction limiting circuit is further configured to allow a remaining part of the output current in the first direction to flow to the sensing voltage generation circuit, and the sensing voltage generation circuit is further configured to generate a first sensing voltage proportional to a magnitude of the remaining part of the output current in the first direction.

14. The DC/DC converter of claim 8, wherein, in response to the current transformer generating an output current in a second direction, the voltage limiting circuit is further configured to allow a voltage at the both ends of the secondary side to be a fourth voltage as at least a part of the output current in the second direction flows through the voltage limiting circuit, the current direction limiting circuit is further configured to limit a flow of the output current in the second direction to the sensing voltage generation circuit, and the sensing voltage generation circuit is further configured to generate a second sensing voltage according to the fourth voltage.

* * * * *